(12) United States Patent
Celik et al.

(10) Patent No.: US 10,042,015 B2
(45) Date of Patent: Aug. 7, 2018

(54) DUAL-PURPOSE DISPLACER SYSTEM AND METHOD

(71) Applicant: General Electric Company, Schenectady, NY (US)

(72) Inventors: Dogan Celik, Irmo, SC (US); Mark O. Derakhshan, Florence, SC (US); Peter Jarvis, Florence, SC (US); Yuri Lvovsky, Florence, SC (US); Stuart Paul Feltham, Florence, SC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 334 days.

(21) Appl. No.: 14/928,040

(22) Filed: Oct. 30, 2015

(65) Prior Publication Data

US 2017/0123025 A1 May 4, 2017

(51) Int. Cl.
*G01R 33/38* (2006.01)
*F17C 5/04* (2006.01)
*F17C 3/08* (2006.01)
*G01R 33/3815* (2006.01)
*F17C 13/02* (2006.01)

(52) U.S. Cl.
CPC .......... *G01R 33/3804* (2013.01); *F17C 3/085* (2013.01); *F17C 5/04* (2013.01); *F17C 13/02* (2013.01); *G01R 33/3815* (2013.01); *F17C 2250/0408* (2013.01); *F17C 2250/061* (2013.01); *F17C 2250/0689* (2013.01)

(58) Field of Classification Search
CPC ............ G01R 33/3804; G01R 33/3815; G01R 33/3403; F17C 3/085; F17C 13/02; F17C 2250/0408; F17C 5/04
See application file for complete search history.

(56) References Cited

U.S. PATENT DOCUMENTS

| 8,598,881 | B2 | 12/2013 | Jiang et al. | |
|---|---|---|---|---|
| 2006/0022779 | A1* | 2/2006 | Jiang ..................... | F25D 19/006 335/216 |
| 2011/0136671 | A1* | 6/2011 | Citver ................ | G01R 33/3804 505/163 |
| 2012/0108433 | A1* | 5/2012 | Jiang .................. | G01R 33/3815 505/163 |
| 2014/0018243 | A1* | 1/2014 | Gross ................. | G01R 33/3804 505/162 |

* cited by examiner

*Primary Examiner* — Brian King

(57) ABSTRACT

A dual-purpose displacer for adjusting a liquid cryogen level in a cryostat, the dual-purpose displacer includes a displacer wall having an exterior displacer surface and an interior displacer surface. The interior displacer surface defines a displacing chamber configured to contain a first portion of liquid cryogen. The exterior displacer surface is configured to displace a second portion of liquid cryogen contained in a cryogenic chamber of the cryostat. The dual-purpose displacer is disposed within the cryogenic chamber of the cryostat and configured to transfer the first portion of liquid cryogen contained within the displacing chamber to the cryogenic chamber.

19 Claims, 5 Drawing Sheets

DUAL-PURPOSE DISPLACER SYSTEM AND METHOD

BACKGROUND

Technical Field

Embodiments of the invention relate generally to superconducting magnets and, more specifically, to a system and method for a displacer used to adjust a level of liquid cryogen within the cryostat of a magnet.

Discussion of Art

Magnetic resonance imaging (MRI) is a widely accepted and commercially available technique for obtaining digitized visual images representing the internal structure of objects having substantial populations of atomic nuclei that are susceptible to nuclear magnetic resonance (NMR). Many MRI systems use superconductive magnets to impose a strong main magnetic field on the nuclei in the object to be imaged. The nuclei are excited by a radio frequency (RF) signal at characteristics NMR (Larmor) frequencies. By spatially disturbing localized magnetic fields surrounding the object and analyzing the resulting RF responses from the nuclei as the excited protons relax back to their lower energy normal state, a map or image of these nuclei responses as a function of their spatial location is generated and displayed. An image of the nuclei responses provides a non-invasive view of an object's internal structure. Many superconductive magnets (hereinafter also referred to simply as magnets) perform best when kept at very low temperatures. Accordingly, many magnets use a liquid cryogen contained in a cryostat to cool the coils of the magnets.

As most liquid cryogens are expensive, many attempts have been made to reduce the amount of liquid cryogen required to cool a magnet during normal operations. Several known methods to reduce the amount of liquid cryogen inside a cryostat include the use of sealed containers known as "dummy" displacers. Dummy displacers often include a ball or other sealed container shape wherein the volume of the shape is static. By placing a dummy displacer in the cryostat, the static volume of the dummy displacer displaces the liquid cryogen, thereby reducing the total volume needed to sufficiently cover the coils of a magnet. Other methods to reduce the amount of liquid cryogen needed to cool a magnet during normal operations include incorporating excised spaces in the design of the cryostat. While both dummy displacers and cryostats with excised spaces reduce the amount of liquid cryogen needed to cool a magnet during normal operations, however, neither approach addresses the problems resulting from the loss of liquid cryogen due to evaporation.

For example, many liquid cryogens, such as helium (He), have low boiling points. As a result, many magnets often lose liquid cryogen due to evaporation during normal operations. Some magnets, known as zero-boil-off magnets, attempt to reduce liquid cryogen loss due to evaporation by using a coldhead with a compressor. Even zero-boil-off magnets lose liquid cryogen over time during normal operations. Additionally, it is often more economical to fill a magnet with liquid cryogen at a manufacturing facility prior to shipment. A sufficient power supply to cool a magnet and/or to power a coldhead, however, is typically unavailable during shipment of a magnet. Accordingly, many magnets lose a significant amount of liquid cryogen during long shipments. Attempting to operate a magnet that has lost a significant amount of liquid cryogen could potentially damage the magnet. As such, many magnets need to be refilled with liquid cryogen during installation. As will be appreciated, the process of adding liquid cryogen to compensate for losses incurred during shipment adds extra time and cost to the installation process.

What is needed, therefore, is a system and method to better manage liquid cryogen contained in superconducting magnets.

BRIEF DESCRIPTION

In an embodiment, a dual-purpose displacer for adjusting a liquid cryogen level in a cryostat is shown. The dual-purpose displacer includes a displacer wall having an exterior displacer surface and an interior displacer surface. The interior displacer surface defines a displacing chamber configured to contain a first portion of liquid cryogen. The exterior displacer surface is configured to displace a second portion of liquid cryogen contained in a cryogenic chamber of the cryostat. The dual-purpose displacer is disposed within the cryogenic chamber of the cryostat and configured to transfer the first portion of liquid cryogen contained within the displacing chamber to the cryogenic chamber.

In another embodiment, a method for filling a cryostat with liquid cryogen is shown. The method includes receiving, at a displacing chamber defined by the interior displacer surface of a dual-purpose displacer contained within a cryogenic chamber of the cryostat, a first portion of liquid cryogen. The method further includes containing the first portion of liquid cryogen within the displacing chamber. The method further includes receiving, at the cryogenic chamber of the cryostat, a second portion of liquid cryogen. The method further includes containing the second portion of liquid cryogen within the cryogenic chamber. The method further includes displacing the second portion of liquid cryogen within the cryogenic chamber via an exterior displacer surface of the dual-purpose displacer, wherein the dual-purpose displacer is configured to transfer the first portion of liquid cryogen contained within the displacing chamber to the cryogenic chamber.

In yet another embodiment, a method for adjusting a liquid cryogen level of a cryostat is shown. The method includes containing a first portion of liquid cryogen within a displacing chamber defined by the interior displacer surface of a dual-purpose displacer disposed within a cryogenic chamber of the cryostat, wherein an exterior displacer surface of the dual-purpose displacer is configured to displace a second portion of liquid cryogen contained within the cryogenic chamber. The method further includes transferring the first portion of liquid cryogen from the displacing chamber to the cryogenic chamber.

DRAWINGS

The present invention will be better understood from reading the following description of non-limiting embodiments, with reference to the attached drawings, wherein below:

DETAILED DESCRIPTION

Figure 1:
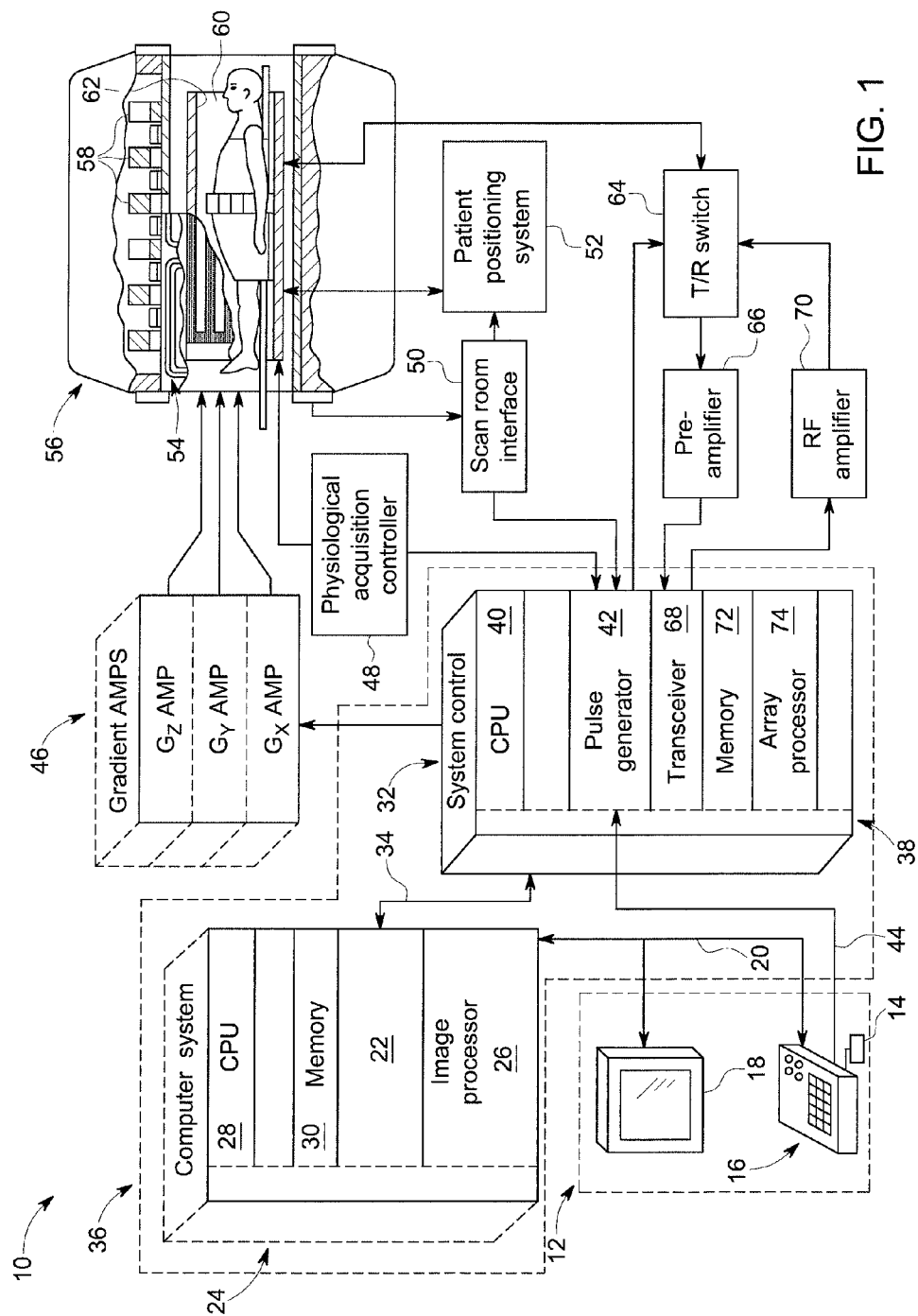
FIG. 1 is a block diagram of an exemplary magnetic resonance imaging (MRI) system in accordance with an embodiment of the invention.

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled, "electrically connected" and "electrical communication" means that the referenced elements are directly or indirectly connected such that an electrical current may flow from one to the other. The connection may include a direct conductive connection (i.e., without an intervening capacitive, inductive or active element), an inductive connection, a capacitive connection, and/or any other suitable electrical connection. Intervening components may be present.

Additionally, as used herein, the terms "ramp up" and "ramp down" indicate the processes of injecting and removing current into and from a magnet, respectively. The term "quench" is used to describe the state of a superconductive wire which has regained its resistance after warming up and the term "ride-through time" indicates the length of time from when a coldhead with compressor on a zero-boil-off magnet ceases to operate to the time at which the superconducting coils of the magnet become quenched.

While the embodiments disclosed herein are described with respect to a magnetic resonance imaging (MRI) system, it is to be understood that embodiments of the present invention are equally applicable to devices such as RF cavity-based accelerators, free electron lasers, and any other device that uses a liquid cryogen for the purpose of maintaining very low temperatures. As will be appreciated, embodiments of the present invention related imaging systems may be used to analyze animal tissue generally and are not limited to human tissue.

Referring to FIG. 1, the major components of a MRI system 10 incorporating an embodiment of the invention are shown. Operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34.

The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50 which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

The MR signals picked up by the RF coil 62 are digitized by the transceiver module 68 and transferred to a memory module 72 in the system control 32. A scan is complete when an array of raw k-space data has been acquired in the memory module 72. This raw k-space data is rearranged into separate k-space data arrays for each image to be reconstructed, and each of these is input to an array processor 74 which operates to Fourier transform the data into an array of image data. This image data is conveyed through the serial link 34 to the computer system 22 where it is stored in memory 30. In response to commands received from the operator console 12, this image data may be archived in long term storage or it may be further processed by the image processor 26 and conveyed to the operator console 12 and presented on the display 18.

Figure 2:
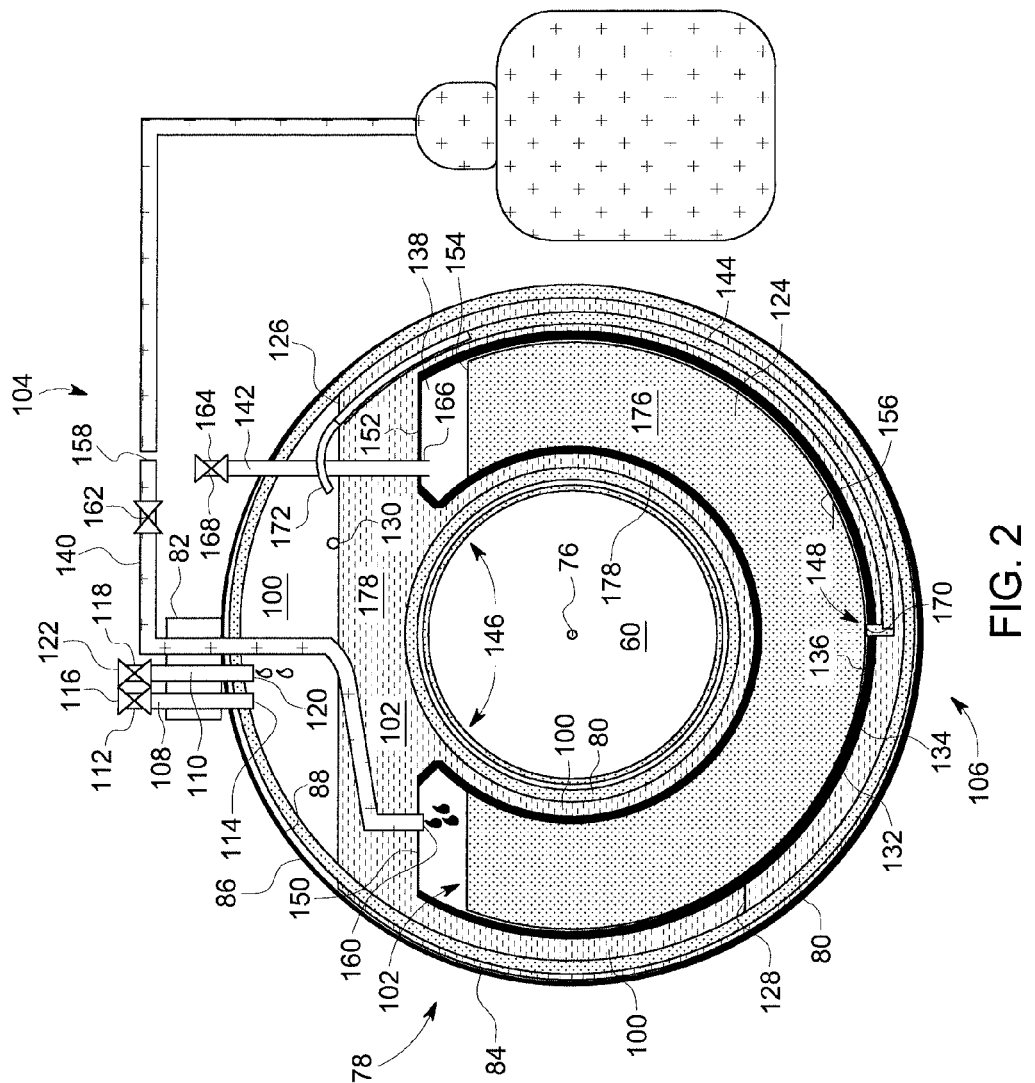
FIG. 2 is a schematic cross-sectional view of the MRI system of FIG. 1 depicting a dual-purpose displacer in accordance with an embodiment of the invention.

Referring now to FIG. 2, a schematic side elevation view of the magnet 58 is shown, in accordance with an embodiment of the invention. The magnet 58 is cylindrical in shape having a center axis 76. The magnet 58 includes a cryostat 78, and one or more radially aligned longitudinally spaced apart superconductive coils 80. The superconductive coils 80 are capable of carrying large electrical currents and are designed to create the $B_0$ field within the patient/target volume 60. In certain embodiments, the magnet 58 includes a coldhead with a compressor 82 that recompresses gaseous cryogen back into a liquid state in order to keep the liquid cryogen level constant during operation of the magnet 58. As will be appreciated, the magnet 58 may further include both a terminal shield and a vacuum vessel (not shown) surrounding the cryostat 78 in order to help insulate the cryostat 78 from heat generated by the rest of the MRI system 10 (FIG. 1). The magnet 58 may still further include other elements such as covers, supports, suspension members, end caps, brackets, etc. (not shown). While the embodiment of the magnet 58 shown in FIGS. 1-5 utilizes a cylindrical topology, it should be understood that topologies other than cylindrical may be used. For example, a flat geometry in a split-open MRI system may also utilize embodiments of the invention described below.

As further shown in FIG. 2, the cryostat 78 is designed to maintain the temperature of the superconducting coils 80 at an appropriate critical temperature, such as 10 Kelvin or lower, so that the superconducting coils 80 are in a superconducting state with zero, or near zero, resistance. In the depicted embodiment, the cryostat 78 has a cryostat wall 84 having an exterior cryogenic surface 86 and an interior cryogenic surface 88. The interior cryogenic surface 88 defines an enclosed cryogenic chamber 100 that contains a liquid cryogen 102 such as helium (He). The amount of liquid cryogen 102 in the cryostat 78 may depend on the desired ramp up, ramp down and/or ride-through time of the magnet 58. In an embodiment, the cryostat 78 may be a stainless steel vessel.

As depicted, the cryostat 78 has a top end 104 and a bottom end 106 opposite the top end 104. The bottom end 106 of the cryostat 78 is the location within the cryogenic chamber 100 where a pressure of the liquid cryogen 102 contained within the cryogenic chamber 100 is greatest due to gravity. The cryostat 78 further includes a first cryostat pipe 108 and a second cryostat pipe 110 disposed near the top end 104 of the cryostat that penetrate the cryostat wall 84 and are fluidly connected to the cryogenic chamber 100. The first cryostat pipe 108 has a first end 112 disposed outside the cryogenic chamber 100, a second end 114 disposed inside the cryogenic chamber 100 near the top end 104, and a valve 116. The second cryostat pipe 110 has a first end 118 disposed outside the cryogenic chamber 100, a second end 120 disposed inside the cryogenic chamber 100 near the top end 104, and a valve 122. The first 108 and second 110 cryostat pipes may be used to vent and/or fill the cryogenic chamber 100 with a liquid cryogen 102. The cryostat 78 further includes a dual-purpose displacer 124 disposed within the cryogenic chamber 100. In embodiments, the cryostat 78 may include multiple dual-purpose displacers 124 within the cryogenic chamber 100 which may or may not be interconnected.

The cryogenic chamber 100 encloses the superconducting coils 80 and contains a liquid cryogen 102, such as helium (He). The cryogenic chamber 100 may have a desired-max-level line 126 that designates a desired maximum liquid cryogen level to be contained within the cryogenic chamber 100, and a desired-min-level line 128 that designates a desired minimum liquid cryogen level to be contained within the chamber 100. The chamber 100 may also have additional level lines (not shown). In embodiments, the chamber 100 further includes a level probe/sensor 130 that detects the liquid cryogen level within the chamber 100. The sensor 130 may also transmit information about the liquid cryogen level within the cryogenic chamber 100 to the MRI controller (shown as 36 in FIG. 1) or other processing device.

The dual-purpose displacer 124 is disposed within the chamber 100 and has a displacer wall 132 having an exterior displacer surface 134 and an interior displacer surface 136. The exterior displacer surface 134 is configured to displace the liquid cryogen 102 contained within the cryogenic chamber 100 by forcing the liquid cryogen 102 out of the volume occupied by the dual-purpose displacer 124. In turn, less liquid cryogen 102 is needed in the cryogenic chamber 100 to sufficiently cover/cool the superconducting coils 80.

The interior displacer surface 136 defines a displacer chamber 138 configured to contain a liquid cryogen 102. In the depicted embodiment, the dual-purpose displacer 124 includes a first displacer pipe 140, a second displacer pipe 142 and a dispensing tube 144. The dual-purpose displacer 124 may further have an open cylindrical shape having a top end 146 and a bottom end 148 opposite the top end 146. The top end 146 of the dual-purpose displacer 124 may have a first end 150 and a second end 152. The bottom end 148 of the dual-purpose displacer 124 is the location within the displacing chamber 138 where a pressure of liquid cryogen 102 within the chamber 138 is greatest due to gravity. In embodiments, the dual-purpose displacer 124 is positioned at the bottom end 106 of the cryostat 78 such that the bottom end 148 of the dual-purpose displacer 124 is aligned with bottom end 106. This ensures that the dual-purpose displacer 124 is covered by liquid cryogen 102 even after the magnet 58 has lost a significant amount of liquid cryogen 102 due to evaporation.

As stated above, the interior displacer surface 136 defines the displacing chamber 138 that contains liquid cryogen 102. In embodiments, the interior displacer surface 136 may define multiple displacing chambers 138 which may or may not be interconnected. The displacing chamber 138 may have a desired-max-level line 154 that designates a desired maximum liquid cryogen level to be contained within the displacing chamber 138, and a desired-min-level line 156 that designates a desired minimum liquid cryogen level to be contained within the displacing chamber 138. In embodiments, the desire minimum liquid cryogen level of the displacing chamber 138 may be "empty."

The first 140 and second 142 displacer pipes penetrate both the cryostat wall 84 and the displacer wall 132 such that the first 140 and second 142 displacer pipes are fluidly connected to the displacing chamber 138. The first displacer pipe 140 has a first end 158 disposed outside the cryogenic chamber 100, a second end 160 disposed inside the displacing chamber 138 near the first end 150 of the dual-purpose displacer 124, and a valve 162. The second displacer pipe 142 has a first end 164 disposed outside the cryogenic chamber 100, a second end 166 disposed inside the displacing chamber 138 near the second end 152 of the dual-purpose displacer 124, and a valve 168. The first and second displacer pipes 140, 142 are used to vent and/or fill the displacing chamber 138 with liquid cryogen 102. Accordingly, in embodiments, the first ends 158 and 164 of the first 140 and second 142 displacer pipes may be located above the desired-max-level line 126 of the cryogenic chamber 100.

As shown, the dispensing tube 144 penetrates the displacer wall 132 and includes a first end 170 disposed at or near the bottom end 148 of the dual-purpose displacer 124, and a second end 172 disposed outside the displacing chamber 138 and within the cryogenic chamber 100 above the desired-max-level line 126. Embodiments of the invention may have a heater (shown as 174 in FIG. 5) disposed near or within the displacing chamber 138.

In operation, according to an embodiment, a cryostat 78 having a dual-purpose displacer 124 may be filled with liquid cryogen 102 by receiving a first portion of liquid cryogen 176 at the displacing chamber 138. The first portion of liquid cryogen 176 may be received at the displacing chamber 138 via one of the first 140 or second 142 displacer pipes. The other pipe of the first 140 or second 142 displacer pipes can be utilized to vent the displacing chamber 138 as the first portion of liquid cryogen 176 flows into the displacing chamber 138. The valves 162 and 168 of the first 140 and second 142 displacer pipes, respectively, may be used to control the rate that the first portion of liquid cryogen 176 flows into the displacing chamber 138 and/or the rate at which the displacing chamber 138 is vented. Once received by the displacing chamber 138, the first portion of liquid cryogen 176 is then contained in the displacing chamber 138.

Additionally, a second portion of liquid cryogen 178 is received at the cryogenic chamber 100. The cryogenic chamber 100 may receive the second portion of liquid cryogen 178 via one of the first 108 or second 110 cryostat pipes. The other of the first 108 or second 110 cryostat pipes may be used to vent the cryogenic chamber 100 as the second portion of liquid cryogen 178 flows into the cryogenic chamber 100. The valves 116 and 122 of the first 108 and second 110 cryostat pipes, respectively, may be used to control the rate that the second portion of liquid cryogen 178 flows into the cryogenic chamber 100 and/or the rate at which the cryogenic chamber 100 is vented. Once received by the cryogenic chamber 100, the second portion of liquid cryogen 178 is contained within the cryogenic chamber 100 where it is displaced by the exterior displacer surface 134 of the dual-purpose displacer 124.

Alternatively, in certain embodiments, the displacing chamber 138 may receive the second portion of liquid cryogen 178 and then transfer the second portion of liquid cryogen 178 to the cryogenic chamber 100. For example, one of the first 108 or second 110 cryostat pipes may be opened via valve 116 or 112, respectively, in order to vent the cryogenic chamber 100. The displacing chamber 138 then receives the second portion of liquid cryogen 178 via one of the first 140 or second 142 displacing pipes. The other of the first 140 or second 142 displacing pipes may be used to vent the displacing chamber 138.

Once received by the displacing chamber 138, the second portion of liquid cryogen 178 is then contained within the displacing chamber 138. Next, the displacing chamber 138 receives the first portion of liquid cryogen 176 via the first 140 or second 142 displacing pipes. As the first portion of liquid cryogen 176 enters the displacing chamber 138, it forces the second portion of liquid cryogen 176 to vacate the displacing chamber 138 and flow/transfer to the cryogenic chamber 100. In embodiments, the first portion of liquid cryogen 176 may force the second portion of liquid cryogen 178 to flow to the bottom end 148 of the dual-purpose displacer 124, enter the first opening 170 of the dispensing tube 144, and flow though the dispensing tube 144 to the second opening 172 of the dispensing tube 144 where the second portion of liquid cryogen 178 is received by the cryogenic chamber 100.

Figure 3:
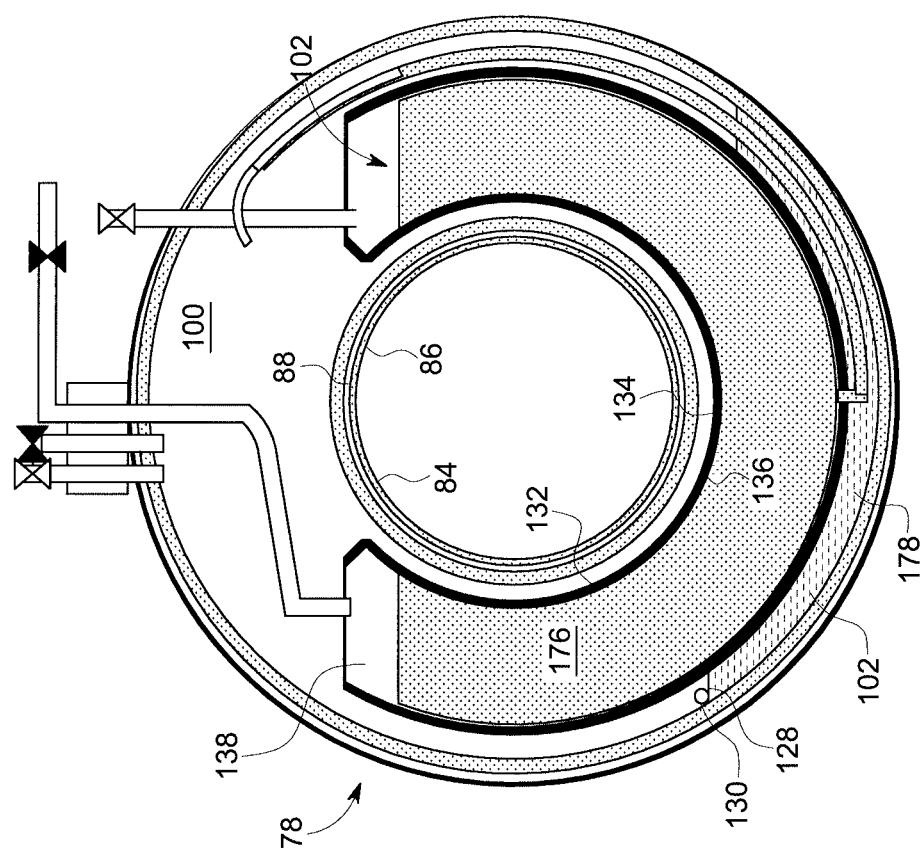
FIG. 3 is another schematic cross-sectional view of the MRI system of FIG. 1 depicting the dual-purpose displacer in accordance with an embodiment of the invention.

Referring now to FIG. 3, once the cryostat 78 has been filled with liquid cryogen 102, the liquid cryogen level in the cryogenic chamber 100 may decrease due to evaporation of the second portion of liquid cryogen 178. Significant evaporation of the second portion of liquid cryogen 178 may occur during transportation of the cryostat 78 from a manufacturing facility to an end user site. Additional evaporation of the second portion of liquid cryogen 178 may occur during repeated operational use of the magnet 58 at the end user site. Accordingly, in embodiments, the liquid cryogen level of the cryogenic chamber 100 may be detected and/or monitored by the sensor 130. In embodiments, the liquid cryogen level of the cryogenic chamber 100 may be monitored by a controller 36 (FIG. 1) or other processor. In other embodiments, the liquid cryogen level of the cryogenic chamber 100 may be manually monitored by an operator.

When the liquid cryogen level within the cryogenic chamber 100 reaches or drops below the desired-min-level line 128, the cryogen level within the cryogenic chamber 100 is adjusted via transferring the first portion of liquid cryogen 176 from the displacing chamber 138 to the cryogenic chamber 100 thereby raising the liquid cryogen level in the cryogenic chamber 100.

Figure 4:
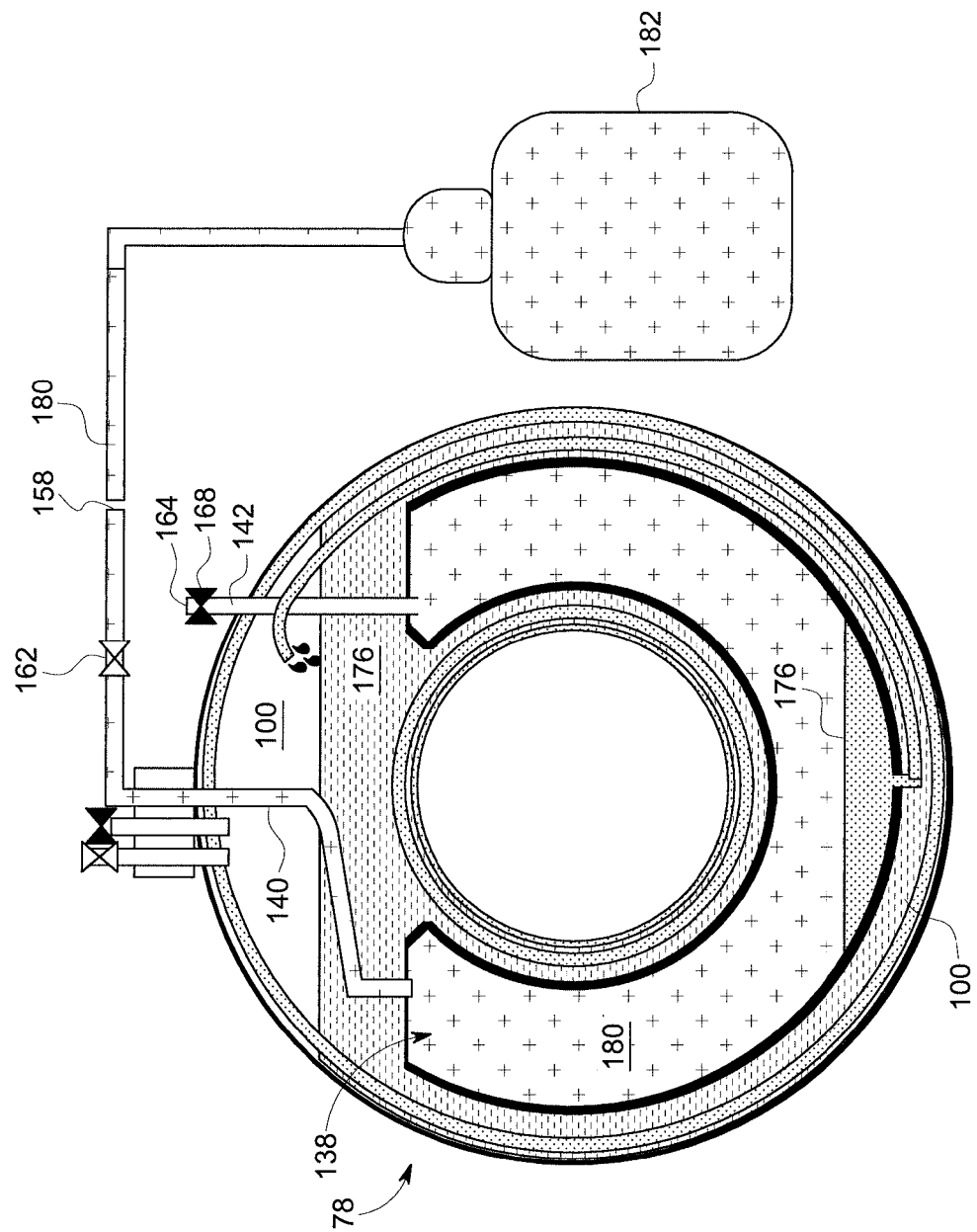
FIG. 4 is yet another schematic cross-sectional view of the MRI system of FIG. 1 depicting the dual-purpose displacer in accordance with an embodiment of the invention.

For example, referring to FIG. 4, in certain embodiments transfer of the first portion of liquid cryogen 176 from the displacing chamber 138 to the cryogenic chamber 100 is effected by pressurizing the displacing chamber 138 with a pressurized medium 180 such that the pressurized medium 180 forces the first portion of liquid cryogen 176 to vacate the displacing chamber 138 and flow into the cryogenic chamber 100. In embodiments, the displacing chamber 138 may be pressurized by receiving the medium 180 from a pressurized medium source 182 fluidly connected to the first end 158 or 164 of the first 140 or second 142 displacer pipes, respectively, while the other of the first 140 or the second 142 displacer pipe is sealed closed by valve 162 or 168, respectively. The pressurized medium source 182 may be a pressurized helium (He) tank and the fluid connection between the pressurized medium source 182 and the first 140 or second 142 displacer pipe may be a bayonet connection. Moreover, the fluid connection between the pressurized medium source 182 and the first 140 or second 142 displacer pipe may be formed by a stinger. In certain embodiments, the pressurized medium may be another gas or fluid capable of displacing liquid cryogen.

Figure 5:
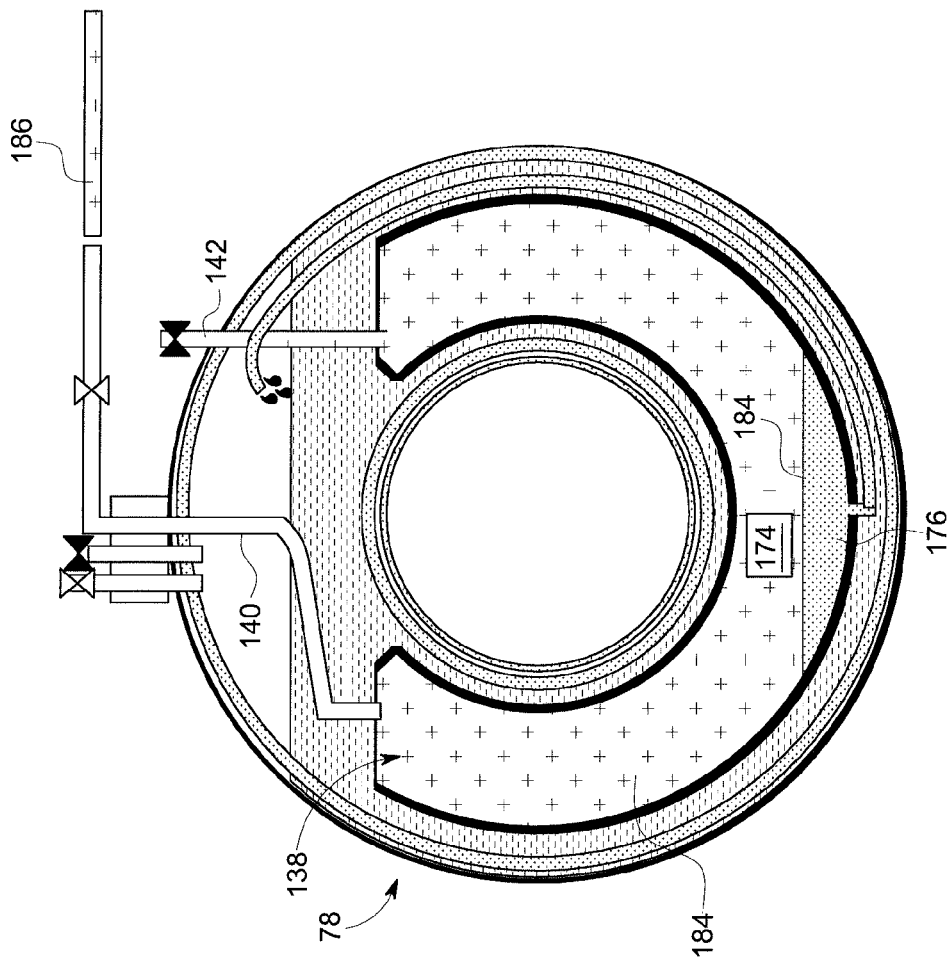
FIG. 5 is still yet another schematic cross-sectional view of the MRI system of FIG. 1 depicting the dual-purpose displacer in accordance with an embodiment of the invention.

Referring to FIG. 5, as stated above, in embodiments a heater 174 may be disposed within or near the displacing chamber 138. In such embodiments, the heater 174 may heat a third portion of liquid cryogen 184 contained within the displacing chamber 138 such that the third portion of liquid cryogen 184 evaporates and becomes the pressurized medium 180. In such embodiments, additional pressurized medium 186 may or may not be received by the displacing chamber 138 via the first 140 or second 142 displacing pipes.

Referring back to FIGS. 2-4 and 5, as can be seen by the embodiments disclosed herein, the displacer 124 is "dual-purpose" in that it acts as both a thermal battery and a displacer by storing/containing liquid cryogen 102 in the displacing chamber 138, which is later used to raise the liquid cryogen level of the cryogenic chamber 100, while simultaneously displacing liquid cryogen 102 contained within the cryogenic chamber 100. Thus, the dual-purpose displacer 124 reduces the amount of liquid cryogen required to operate a magnet 58 while simultaneously increasing the amount of liquid cryogen 102 that can be contained within the cryostat 78.

Accordingly, embodiments of the present invention enable for a faster and less expensive installation of a magnet at an end user site. For example, cryostats 78 using dual-purpose displacers 124 in accordance with the embodiments described herein are more economical than cryostats employing traditional dummy displacers, as the dual-purpose displacer 124 of the present invention may filled with liquid cryogen 102 at a manufacturing site, which is typically less expensive than filling a cryostat at an end user site.

Further, by replacing the evaporated liquid cryogen 102 in the cryogenic chamber 100 with the liquid cryogen 102 contained in the displacing chamber 138, dual-purpose displacers 124 in accordance with certain embodiments are able to keep magnets 58 cool for longer periods of time than traditional displacers and are able cool down a warm magnet 58 immediately after arriving at an end user site.

Further still, dual-purpose displacers 124 in accordance with certain embodiments disclosed herein do not have any moving parts within the displacing chamber 138 or the dispensing tube 144 and, as a result, require little maintenance.

Additionally, the pressure differentials across the displacer wall 132 (pressure of the cryogenic cavity 100/ pressure of the displacing chamber 138) are very small. As a result, the displacer wall 132 may be thin which allows for a reduction in the total weight of the cryostat 78. As used herein, the term "thin" refers to the thickness of the displacer wall 132. For example, in embodiments, the thickness of the displacer wall 132 may be on the order of a millimeter. In other embodiments, the thickness of the displacer wall 132 may be less than a millimeter. Furthermore, in embodiments, the displacer wall 132 may be made from sheet metal with stiffening ridges and simple tubing to eliminate the risk of buckling. For example, in embodiments, the displacer wall 132 may be made from aluminum and/or stainless steel. As the heat capacity of a material depends on its atomic structure, density and mass, by reducing the total weight of the cryostat 78, the total power needed to cool the superconducting coils 80 is reduced.

In embodiments where a cryostat 78 is to be filled with a minimal amount of liquid cryogen, only the cryogenic chamber 100 may be filled with liquid cryogen 102. In such embodiments, the dual-purpose displacer 124 acts solely as a traditional displacer.

Further still, in embodiments, only the dispensing tube 144 may used to fill the displacing chamber 138 and to transfer the liquid cryogen 102 contained within the displacing chamber 138 to the cryogenic chamber 100. In such embodiments, a heater 174 is used to generate the pressurized medium 180.

It is to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a dual-purpose displacer for adjusting a liquid cryogen level in a cryostat is shown. The dual-purpose displacer includes a displacer wall having an exterior displacer surface and an interior displacer surface. The interior displacer surface defines a displacing chamber configured to contain a first portion of liquid cryogen. The exterior displacer surface is configured to displace a second portion of liquid cryogen contained in a cryogenic chamber of the cryostat. The dual-purpose displacer is disposed within the cryogenic chamber of the cryostat and configured to transfer the first portion of liquid cryogen contained within the displacing chamber to the cryogenic chamber. In certain embodiments, the dual-purpose displacer further includes a displacer pipe that penetrates the cryostat and has an end fluidly connected to the displacing chamber; and a dispensing tube having a first end fluidly connected to the displacing chamber, and a second end disposed above a desired-max-level line of the displacing chamber and fluidly connected to the cryogenic chamber. In certain embodiments, the dual-purpose displacer has an open cylindrical shape having a top end and a bottom end. The bottom end being a location within the displacing chamber where a pressure of the first portion of liquid cryogen contained within the displacing chamber is greatest due to the Earth's gravitational pull. The end of the displacer pipe is disposed at or near the top end of the dual-purpose displacer, and the first end of the dispensing tube is disposed at or near the bottom end of the dual-purpose displacer. In certain embodiments, the displacing chamber is configured to receive the first portion of liquid cryogen and the second portion of liquid cryogen from the displacer pipe. In certain embodiments, the displacing chamber is further configured to fill the cryogenic chamber with the second portion of liquid cryogen by way of the dispensing tube. In certain embodiments, the displacing chamber is further configured to transfer the first portion of liquid cryogen contained within the displacing chamber to the cryogenic chamber by receiving a pressurized medium from the displacer pipe. The pressurized medium forces the first portion of liquid cryogen to vacate the displacing chamber by way of the dispensing tube and flow into the cryogenic chamber. In certain embodiments, the dual-purpose displacer further includes a heater disposed within the displacing chamber. The displacing chamber is further configured to transfer the first portion of liquid cryogen contained within the displacing chamber to the cryogenic chamber by way of the heater heating a third portion of liquid cryogen contained within the displacing chamber. The third portion of liquid cryogen evaporates and becomes a pressurized medium that forces the first portion of liquid cryogen to vacate the displacing chamber by way of the dispensing tube and flow into the cryogenic chamber. In certain embodiments, the wall of the dual-purpose displacer is thin. In certain embodiments, the displacing chamber has no moving parts.

Other embodiments provide for a method for filling a cryostat with liquid cryogen. The method includes receiving, at a displacing chamber defined by the interior displacer surface of a dual-purpose displacer contained within a cryogenic chamber of the cryostat, a first portion of liquid cryogen. The method further includes receiving, at the cryogenic chamber of the cryostat, a second portion of liquid cryogen. The method further includes displacing the second portion of liquid cryogen within the cryogenic chamber via an exterior displacer surface of the dual-purpose displacer. The dual-purpose displacer is configured to transfer the first portion of liquid cryogen contained within the displacing chamber to the cryogenic chamber. In certain embodiments, the first portion of liquid cryogen is received at the displacing chamber via a displacer pipe that penetrates the cryostat and has an end fluidly connected to the displacing chamber. The cryogenic chamber may receive the second portion of liquid cryogen from the displacing chamber. The method further includes transferring the second portion of liquid cryogen from the displacing chamber to the cryogenic chamber. In certain embodiments, the second portion of liquid cryogen is transferred from the displacing chamber to the cryogenic chamber via a dispensing tube having a first end fluidly connected to the displacing chamber and a second end disposed above a desired-max-level line of the displacing chamber and fluidly connected to the cryogenic chamber. In certain embodiments, the displacing chamber is further configured to transfer the first portion of the liquid cryogen contained within the displacing chamber to the cryogenic chamber by pressurizing the displacing chamber with a pressurized medium such that the pressurized medium forces the first portion of liquid cryogen to vacate the displacing chamber.

Yet still other embodiments provide for a method for adjusting a liquid cryogen level of a cryostat. The method includes containing a first portion of liquid cryogen within a displacing chamber defined by the interior displacer surface of a dual-purpose displacer disposed within a cryogenic chamber of the cryostat. An exterior displacer surface of the dual-purpose displacer is configured to displace a second portion of liquid cryogen contained within the cryogenic chamber. The method further includes transferring the first portion of liquid cryogen from the displacing chamber to the cryogenic chamber. In certain embodiments, transferring the first portion of liquid cryogen from the displacing chamber to the cryogenic chamber includes pressurizing the displacing chamber with a pressurized medium such that the pressurized medium forces the first portion of liquid cryogen to vacate the displacing chamber. In certain embodiments, pressurizing the displacing chamber with the pressurized medium such that the pressurized medium forces the first portion of liquid cryogen to vacate the displacing chamber includes receiving the pressurized medium, at the displacing chamber, by way of a displacer pipe that penetrates the cryostat, the displacer pipe having a first end fluidly connected to a pressurized medium source, and a second end fluidly connected to the displacing chamber. In certain embodiments, pressurizing the displacing chamber with a pressurized medium such that the pressurized medium forces the first portion of liquid cryogen to vacate the displacing chamber includes heating a third portion of liquid cryogen contained within the displacing chamber such that the third portion of liquid cryogen evaporates and becomes the pressurized medium. In certain embodiments, the first portion of liquid cryogen is transferred from the displacing chamber to the cryogenic chamber via a dispensing tube, the dispensing tube having a first end fluidly connected to the displacing chamber, and a second end fluidly connected to the cryogenic chamber and disposed above a desired-max-level line of the displacing chamber. In certain embodiments, the method further includes detecting the cryogen level of the second portion of liquid cryogen contained within the cryogenic chamber.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted based on 35 U.S.C. § 112(f), unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A dual-purpose displacer for adjusting a liquid cryogen level in a cryostat, the dual-purpose displacer comprising:
   a displacer wall having an exterior displacer surface and an interior displacer surface, the interior displacer surface defining a displacing chamber configured to contain a first portion of liquid cryogen, the exterior displacer surface configured to displace a second portion of liquid cryogen contained in a cryogenic chamber of the cryostat, and
   wherein the dual-purpose displacer is disposed within the cryogenic chamber of the cryostat and configured to transfer the first portion of liquid cryogen contained within the displacing chamber to the cryogenic chamber.

2. The dual-purpose displacer of claim 1 further comprising:
   a displacer pipe that penetrates the cryostat and has an end fluidly connected to the displacing chamber; and
   a dispensing tube having a first end fluidly connected to the displacing chamber, and a second end disposed above a desired maximum liquid cryogen level of the cryogenic chamber and fluidly connected to the cryogenic chamber.

3. The dual-purpose displacer of claim 2,
wherein the dual-purpose displacer has an open cylindrical shape having a top end and a bottom end, the bottom end being a location within the displacing chamber where a pressure of the first portion of liquid cryogen contained within the displacing chamber is greatest due to gravity, and
wherein the end of the displacer pipe is disposed at the top end of the dual-purpose displacer, and the first end of the dispensing tube is disposed at the bottom end of the dual-purpose displacer.

4. The dual-purpose displacer of claim 2, wherein displacing chamber is configured to receive the first portion of liquid cryogen and the second portion of liquid cryogen from the displacer pipe.

5. The dual-purpose displacer of claim 4, wherein the displacing chamber is further configured to fill the cryogenic chamber with the second portion of liquid cryogen by way of the dispensing tube.

6. The dual-purpose displacer of claim 2, wherein the displacing chamber is further configured to transfer the first portion of liquid cryogen contained within the displacing chamber to the cryogenic chamber by receiving a pressurized medium from the displacer pipe, and wherein the pressurized medium forces the first portion of liquid cryogen to vacate the displacing chamber by way of the first end of the dispensing tube and flow into the cryogenic chamber through the second end of the dispensing tube.

7. The dual-purpose displacer of claim 2 further comprising a heater disposed within the displacing chamber, wherein the displacing chamber is further configured to transfer the first portion of liquid cryogen contained within the displacing chamber to the cryogenic chamber by way of the heater heating a third portion of liquid cryogen contained within the displacing chamber such that the third portion of liquid cryogen evaporates and becomes a pressurized medium that forces the first portion of liquid cryogen to vacate the displacing chamber by way of the first end of the dispensing tube and flow into the cryogenic chamber through the second end of the dispensing tube.

8. The dual-purpose displacer of claim 1, wherein the displacing chamber has no moving parts.

9. A method for filling a cryostat with liquid cryogen, the method comprising:
receiving, at a displacing chamber defined by an interior displacer surface of a dual-purpose displacer contained within a cryogenic chamber of the cryostat, a first portion of liquid cryogen;
receiving, at the cryogenic chamber of the cryostat, a second portion of liquid cryogen; and
displacing the second portion of liquid cryogen within the cryogenic chamber via an exterior displacer surface of the dual-purpose displacer,
wherein the dual-purpose displacer is configured to transfer the first portion of liquid cryogen contained within the displacing chamber to the cryogenic chamber.

10. The method of claim 9, wherein the first portion of liquid cryogen is received at the displacing chamber via a displacer pipe that penetrates the cryostat and has an end fluidly connected to the displacing chamber.

11. The method of claim 9 wherein the cryogenic chamber receives the second portion of liquid cryogen from the displacing chamber.

12. The method of claim 11, wherein the second portion of liquid cryogen is transferred from the displacing chamber to the cryogenic chamber via a dispensing tube having a first end fluidly connected to the displacing chamber and a second end disposed above a desired maximum liquid cryogen level of the cryogenic chamber and fluidly connected to the cryogenic chamber.

13. The method of claim 9 wherein the displacing chamber is further configured to transfer the first portion of the liquid cryogen contained within the displacing chamber to the cryogenic chamber by pressurizing the displacing chamber with a pressurized medium such that the pressurized medium forces the first portion of liquid cryogen to vacate the displacing chamber.

14. A method for adjusting a liquid cryogen level of a cryostat, the method comprising:
containing a first portion of liquid cryogen within a displacing chamber defined by the interior displacer surface of a dual-purpose displacer disposed within a cryogenic chamber of the cryostat,
wherein an exterior displacer surface of the dual-purpose displacer is configured to displace a second portion of liquid cryogen contained within the cryogenic chamber; and
transferring the first portion of liquid cryogen from the displacing chamber to the cryogenic chamber.

15. The method of claim 14, wherein transferring the first portion of liquid cryogen from the displacing chamber to the cryogenic chamber comprises:
pressurizing the displacing chamber with a pressurized medium such that the pressurized medium forces the first portion of liquid cryogen to vacate the displacing chamber.

16. The method of claim 15, wherein pressurizing the displacing chamber with the pressurized medium such that the pressurized medium forces the first portion of liquid cryogen to vacate the displacing chamber comprises:
receiving the pressurized medium, at the displacing chamber, by way of a displacer pipe that penetrates the cryostat, the displacer pipe having a first end fluidly connected to a pressurized medium source, and a second end fluidly connected to the displacing chamber.

17. The method of claim 15, wherein pressurizing the displacing chamber with a pressurized medium such that the pressurized medium forces the first portion of liquid cryogen to vacate the displacing chamber comprises:
heating a third portion of liquid cryogen contained within the displacing chamber such that the third portion of liquid cryogen evaporates and becomes the pressurized medium.

18. The method of claim 14, wherein the first portion of liquid cryogen is transferred from the displacing chamber to the cryogenic chamber via a dispensing tube, the dispensing tube having a first end fluidly connected to the displacing chamber, and a second end fluidly connected to the cryogenic chamber and disposed above a desired maximum liquid cryogen level of the cryogenic chamber.

19. The method of claim 14, the method further comprising:
detecting the cryogen level of the second portion of liquid cryogen contained within the cryogenic chamber.

* * * * *